United States Patent [19]

Yamamoto

[11] Patent Number: 5,579,269
[45] Date of Patent: Nov. 26, 1996

[54] SEMICONDUCTOR MEMORY DEVICE HAVING REDUNDANCY SERIAL ACCESS MEMORY PORTION

[75] Inventor: Kouji Yamamoto, Hyogo, Japan

[73] Assignee: Mitsubishi Denki Kabushiki Kaisha, Tokyo, Japan

[21] Appl. No.: 632,280

[22] Filed: Apr. 15, 1996

Related U.S. Application Data

[63] Continuation of Ser. No. 405,672, Mar. 17, 1995, abandoned.

[30] Foreign Application Priority Data

Mar. 30, 1994 [JP] Japan .................... 6-061526

[51] Int. Cl.$^6$ .................................................. G11C 7/00
[52] U.S. Cl. .......................................... 365/200; 365/221
[58] Field of Search ........................... 365/200, 230.03, 365/189.05, 221, 207, 208

[56] References Cited

U.S. PATENT DOCUMENTS

| | | | |
|---|---|---|---|
| 4,701,887 | 10/1987 | Ogawa | 365/200 |
| 4,998,223 | 3/1991 | Akaogi | 365/200 |
| 5,347,484 | 9/1994 | Kwong | 365/200 |

*Primary Examiner*—A. Zarabian
*Attorney, Agent, or Firm*—Lowe, Price, LeBlanc & Becker

[57] ABSTRACT

A frame buffer memory of the present invention has a serial access memory portion including m normal units, a redundancy unit, and a serial selector. Each of the normal units includes four sense amplifiers, one data register provided corresponding to these sense amplifiers, and four transfer gates provided corresponding to these sense amplifiers and each connected between a corresponding sense amplifier and the data register. The redundancy unit includes two redundancy sense amplifiers, one redundancy data register provided corresponding to these redundancy sense amplifiers, and four redundancy transfer gates provided corresponding to these sense amplifiers. Two of the redundancy transfer gates are connected between a corresponding redundancy sense amplifier and the redundancy data register. m transfer gates are provided corresponding to m data registers, and a redundancy transfer gate is provided corresponding to the redundancy data register. The m transfer gates in the m normal units are all turned on in response to a corresponding one of four control signals. Two transfer gates in the redundancy unit are both turned on in response to corresponding two of the four control signals.

6 Claims, 2 Drawing Sheets

SEMICONDUCTOR MEMORY DEVICE HAVING REDUNDANCY SERIAL ACCESS MEMORY PORTION

This application is a continuation of application Ser. No. 08/405,672 filed Mar. 17, 1995 abandoned Apr. 15, 1996.

BACKGROUND OF THE INVENTION

1. Field of the Invention

The present invention relates to semiconductor memory devices, and more particularly, to redundancy of a serial access memory portion in a frame buffer memory.

2. Description of the Background Art

FIG. 2 is a block diagram showing a configuration of a serial access memory portion in a conventional frame buffer memory.

Referring to FIG. 2, the frame buffer memory includes a memory cell array (not shown) for storing a plurality of data, 4×m sense amplifiers 11–14, 4×m transfer gates 31–34, m data registers 20, and m pairs of transfer gates 40a, 40b.

Four sense amplifiers 11–14, four transfer gates 31–34, one data register 20, and one pair of transfer gates 40a, 40b configure each of normal units N1-Nm.

Respective sense amplifiers 11–14 amplify and hold data D1–D4 read out from the memory cell array. Respective transfer gates 31–34 transfer data between a corresponding one of sense amplifiers 11–14 and data register 20 in response to a corresponding one of control signals CS1–CS4. These data is transferred through a data transfer line 38.

Data register 20 can hold data temporarily. A pair of transfer gates 40a, 40b transfers data between data register 20 and data buses 42a, 42b in response to select signals SE1-SEm.

The frame buffer memory further includes one redundancy unit Rp configured similar to normal units N1-Nm. The redundancy unit Rp includes four redundancy sense amplifiers 51–54, four redundancy transfer gates 61–64, one redundancy data register 60, and one pair of redundancy transfer gates 70a, 70b.

Respective sense amplifiers 51–54 amplify and hold data DR1–DR4 read out from a redundancy portion of the memory cell array. Respective transfer gates 61–64 transfer data between a corresponding one of sense amplifiers 51–54 and a redundancy data register 60 in response to a corresponding one of four control signals CS1–CS4. These data is transferred through a redundancy data transfer line 68.

Redundancy data register 60 can hold data temporarily. A pair of redundancy transfer gates 70a, 70b transfers data between redundancy data register 60 and redundancy data buses 72a, 72b in response to a redundancy select signal SER.

The frame buffer memory further includes a serial selector 80. In normal operation, that is, when correct data is read out from all data registers 20 in normal units N1-Nm, serial selector 80 sequentially selects data registers 20 in normal units N1-Nm to read out data from the selected data register 20 to data buses 42a, 42b, or to write data from data buses 42a, 42b to data register 20.

On the other hand, in abnormal operation, that is, when correct data is not read out from data registers 20 in normal units N1-Nm, serial selector 80 selects redundancy data register 60 instead of data register 20 to read out data from redundancy data register 60 to redundancy data buses 72a, 72b, or to write data from redundancy data buses 72a, 72b to redundancy data register 60.

Operation of the serial access memory portion will now be described.

In normal operation, 4×m data D1–D4 read out from the memory cell array is amplified and held by sense amplifiers 11–14.

When control signal CS1 rises to a logical high or H level, m transfer gates 31 corresponding to the signal are rendered conductive. When control signal CS2 rises to the H level, m transfer gates 32 corresponding to the signal are rendered conductive. When control signal CS3 rises to the H level, m transfer gates 33 corresponding to the signal are rendered conductive. Similarly, when control signal CS4 rises to the H level, m transfer gates 34 corresponding to the signal are rendered conductive. As a result, in each of normal units N1-Nm, a corresponding one of sense amplifiers 11–14 and data register 20 are connected each other, and data is transferred from the corresponding one of sense amplifiers 11–14 to data register 20 through data transfer line 38.

In each of normal units N1-Nm, four sense amplifiers 11–14 are connected to one data register 20 through four transfer gates 31–34. Therefore, data in these sense amplifiers 11–14 is selectively transferred to one data register 20 in response to four control signals CS1–CS4.

After data is transferred to data register 20, select signals SE1-SEm from serial selector 80 rise to the H level sequentially. In response to select signals SE1-SEm attaining the H level, a corresponding transfer gate pair 40a, 40b is rendered conductive. Data is transferred from data register 20 to data buses 42a, 42b through transfer gate pair 40a, 40b, and further provided externally.

The description will now be given of the case where data is not correct which is read out from one data register 20 in normal units N1-Nm.

When data is not correct which is transferred from a memory cell to data register 20 through sense amplifier 13 and transfer gate 33 in normal unit N1, for example, correct data is stored in advance in, instead of the memory cell, a memory cell corresponding to sense amplifier 53 in the redundancy unit Rp.

As in the above normal operation, data from the memory cell array is amplified and held by 4×m sense amplifiers 11–14 and four redundancy sense amplifiers 51–54.

When any one of four control signals CS1–CS4 rises to the H level, either of m transfer gates 31, m transfer gates 32, m transfer gates 33 or m transfer gates 34 corresponding to the control signal and a corresponding one of redundancy transfer gates 61–64 are rendered conductive. When control signal CS3 rises to the H level, for example, m transfer gates 33 and one redundancy transfer gate 63 are rendered conductive. As a result, in each of normal units N1-Nm, data is transferred from sense amplifier 13 to data register 20 through transfer gate 33. In the redundancy unit Rp, data is transferred from redundancy sense amplifier 53 to redundancy data register 60 through redundancy transfer gate 63.

In this case, data transferred to data register 20 in normal unit N1 is not correct. However, correct data is transferred to redundancy data register 60 instead.

Then, select signals SE1-SEm from serial selector 80 rise to the H level sequentially. In this case, redundancy select signal SER rises to the H level instead of select signal SE1. More specifically, after redundancy select signal SER rises to the H level, select signal SE2 (not shown)—select signal SEm rise to the H level sequentially.

When redundancy select signal SER rises to the H level, data in redundancy data register 60 is transferred to redundancy data buses 72a, 72b through a pair of redundancy transfer gates 70a, 70b, and further provided externally. Then, when select signals SE2-SEm rise to the H level sequentially, data in corresponding data register 20 is transferred to data buses 42a, 42b through a pair of transfer gates 40a, 40b, and further provided externally.

As described above, in the serial access memory portion including the redundancy unit Rp, even if data read out from normal units N1-Nm is not correct, by storing correct data in a predetermined memory cell, the correct data is read out from the redundancy unit Rp.

As described above, in a conventional serial access memory portion, the redundancy unit Rp having the same configuration as normal units N1-Nm is arranged. This is because it is impossible to predict which of four control signals CS1–CS4 at the H level causes erroneous data to be read out from normal units N1-Nm.

However, when erroneous data is read out from normal units N1-Nm only in response to the H level of one of four control signals CS1–CS4, for example, three of four redundancy sense amplifiers 51–54 are wasted. When erroneous data is read out from normal units N1-Nm in response to the H level of two of four control signals CS1–CS4, two of four redundancy sense amplifiers 51–54 are wasted.

SUMMARY OF THE INVENTION

One object of the present invention is to provide a small-sized semiconductor memory device.

Another object of the present invention is to provide a semiconductor memory device having a redundancy serial access memory portion.

Still another object of the present invention is to provide a semiconductor memory device which is reduced in size without lowering its remedy rate.

According to one aspect of the present invention, the semiconductor memory device including a redundancy circuit and capable of storing a plurality of data and reading out serially the stored data includes a plurality of normal sense amplifiers, a plurality of normal registers, a plurality of normal transfer circuits, a redundancy sense amplifier, a redundancy register, a redundancy transfer circuit, and a selecting circuit. The plurality of normal sense amplifiers amplify data. Each of the normal registers is provided corresponding to a predetermined number of the normal sense amplifiers. The plurality of normal transfer circuits are provided corresponding to the plurality of normal registers. Each of the normal transfer circuits selectively transfers data between one of a corresponding predetermined number of the normal sense amplifiers and a corresponding normal register. The redundancy sense amplifier amplifies data. The redundancy register is provided corresponding to the redundancy sense amplifier. The redundancy transfer circuit transfers data between the redundancy sense amplifier and the redundancy register when data is transferred between one of a corresponding predetermined number of the sense amplifiers and a corresponding normal register, and when data is transferred between at least another sense amplifier and a corresponding normal register. When the redundancy circuit is inactivated, the selecting circuit serially selects the plurality of normal registers, and transfers data between the selected normal register and an external portion. When the redundancy circuit is activated, the selecting circuit selects the redundancy register instead of one of the normal registers, and transfers data between the redundancy register and an external portion.

According to another aspect of the present invention, the semiconductor memory device including a redundancy circuit and capable of storing a plurality of data and reading out serially the stored data includes a plurality of normal units, a redundancy unit, an even number of signal lines, and a selecting circuit. Each of the normal units includes an even number of normal sense amplifiers, a normal register, and an even number of normal switching elements. The even number of normal sense amplifiers amplify data. The normal register is provided corresponding to the even number of normal sense amplifiers. The even number of normal switching elements are provided corresponding to the even number of normal sense amplifiers. Each of the normal switching elements is connected between a corresponding normal sense amplifier and the normal register. The redundancy unit includes a plurality of redundancy sense amplifiers, a redundancy register, and a plurality of redundancy switching elements. The plurality of redundancy sense amplifiers amplify data. Each of the redundancy sense amplifiers is provided corresponding to two of the normal sense amplifiers. The redundancy register is provided corresponding to the plurality of redundancy sense amplifiers. The plurality of redundancy switching elements are provided corresponding to the plurality of redundancy sense amplifiers. Each of the redundancy switching elements is connected between a corresponding redundancy sense amplifier and the redundancy register. The even number of signal lines are provided corresponding to the even number of normal sense amplifiers and in common to the normal units and the redundancy unit. Each of the normal switching elements is turned on in response to a corresponding one of the signal lines. Each of the redundancy switching elements is turned on in response to corresponding two of the signal lines. When the redundancy circuit is deactivated, the selecting circuit serially selects the normal registers in the plurality of normal units, and transfers data between the selected normal register and an external portion. When the redundancy circuit is activated, the selecting circuit selects the redundancy register instead of one of the normal registers, and transfers data between the redundancy register and an external portion.

Therefore, the main advantage of the present invention is that the number of redundancy sense amplifiers is reduced since data is transferred from the redundancy sense amplifier to the redundancy register not only when data is transferred from one normal sense amplifier to a corresponding normal register, but also when data is transferred from another normal sense amplifier to a corresponding normal register.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
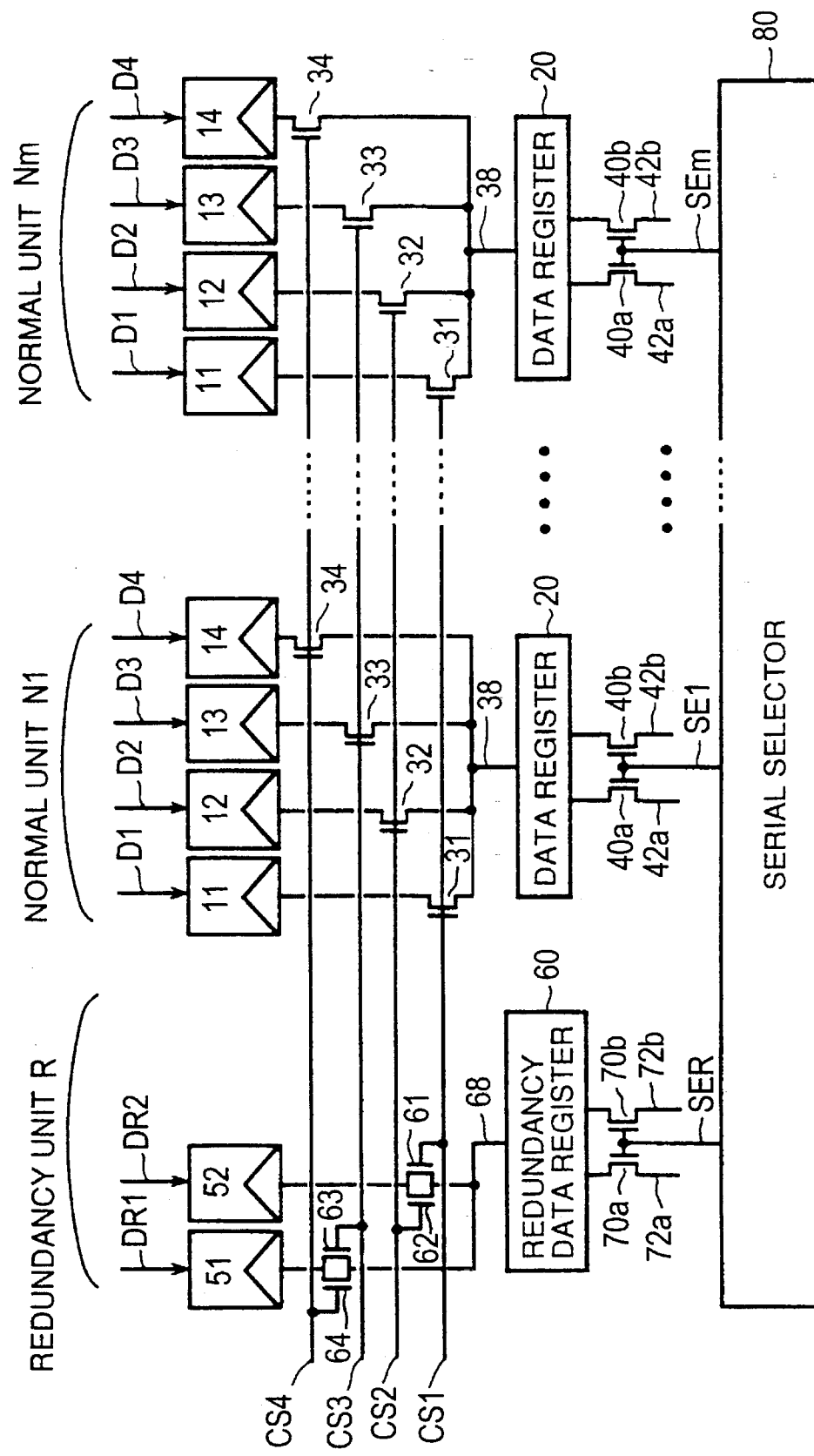
FIG. 1 is a block diagram showing a partial configuration of the semiconductor memory device according to one embodiment of the present invention.

The embodiment of the present invention will be described in detail with reference to the drawings. In the figures, the same reference characters denote the same or corresponding portions.

FIG. 1 is a block diagram showing a configuration of a serial access memory portion in a frame buffer memory according to one embodiment of the present invention.

Referring to FIG. 1, the serial access memory portion includes m normal units N1-Nm, a redundancy unit R, and serial selector 80.

Normal units N1-Nm each include four sense amplifiers 11–14, four transfer gates 31–34, data register 20, a pair of transfer gates 40a, 40b.

Respective sense amplifiers 11–14 amplify and hold data D1–D4 read out from a memory cell array. Transfer gates 31–34 are formed of N channel MOS transistors having gate electrodes receiving control signals CS1–CS4. Each of transfer gates 31–34 is connected between a corresponding one of four sense amplifiers 11–14 and data register 20.

m transfer gates 31 in m normal units N1-Nm all respond to one control signal CS1. m transfer gates 32 in m normal units N1-Nm all respond to one control signal CS2. m transfer gates 33 in m normal units N1-Nm all respond to one control signal CS3. m transfer gates 34 in m normal units N1-Nm all respond to one control signal CS4.

Therefore, in each of normal units N1-Nm, data is selectively transferred between four sense amplifiers 11–14 and data register 20 through data transfer line 38.

Each data register 20 temporarily holds data transferred from sense amplifiers 11–14, and temporarily holds data to be transferred to sense amplifiers 11–14.

Each pair of transfer gates 40a, 40b is configured of two N channel MOS transistors 40a and 40b. Select signals SE1-SEm from serial selector 80 are applied to both gate electrodes of these N channel MOS transistors 40a and 40b. These N channel MOS transistors 40a and 40b are connected between data register 20 and data buses 42a, 42b.

The redundancy unit R includes two redundancy sense amplifiers 51 and 52, four redundancy transfer gates 61–64, a redundancy data register 60 and a pair of transfer gates 70a, 70b.

Redundancy sense amplifiers 51 and 52 amplify and hold data DR1 and DR2 read out from the memory cell array.

Each of redundancy transfer gates 61–64 is formed of an N channel MOS transistor having a gate electrode receiving one of control signals CS1–CS4. Similar to transfer gates 31 in the above normal units N1-Nm, redundancy transfer gates 61 are controlled in response to control signal CS1. Similar to transfer gates 32 in the above normal units N1-Nm, redundancy transfer gates 62 are controlled in response to control signal CS2. Similar to transfer gates 33 in the above normal units N1-Nm, redundancy transfer gates 63 are controlled in response to control signal CS3. Similar to transfer gates 34 in the above normal units N1-Nm, redundancy transfer gates 64 are controlled in response to control signal CS4.

Redundancy transfer gates 61 and 62 are connected between redundancy sense amplifier 52 and redundancy data register 60. Redundancy transfer gates 63 and 64 are connected between redundancy sense amplifier 51 and redundancy data register 60.

Therefore, between redundancy sense amplifier 51 and redundancy data register 60, data is transferred through redundancy data transfer line 68 in response to control signals CS3 and CS4. Between redundancy sense amplifier 52 and redundancy data register 60, data is transferred through redundancy data transfer line 68 in response to control signals CS1 and CS2.

Figure 2:
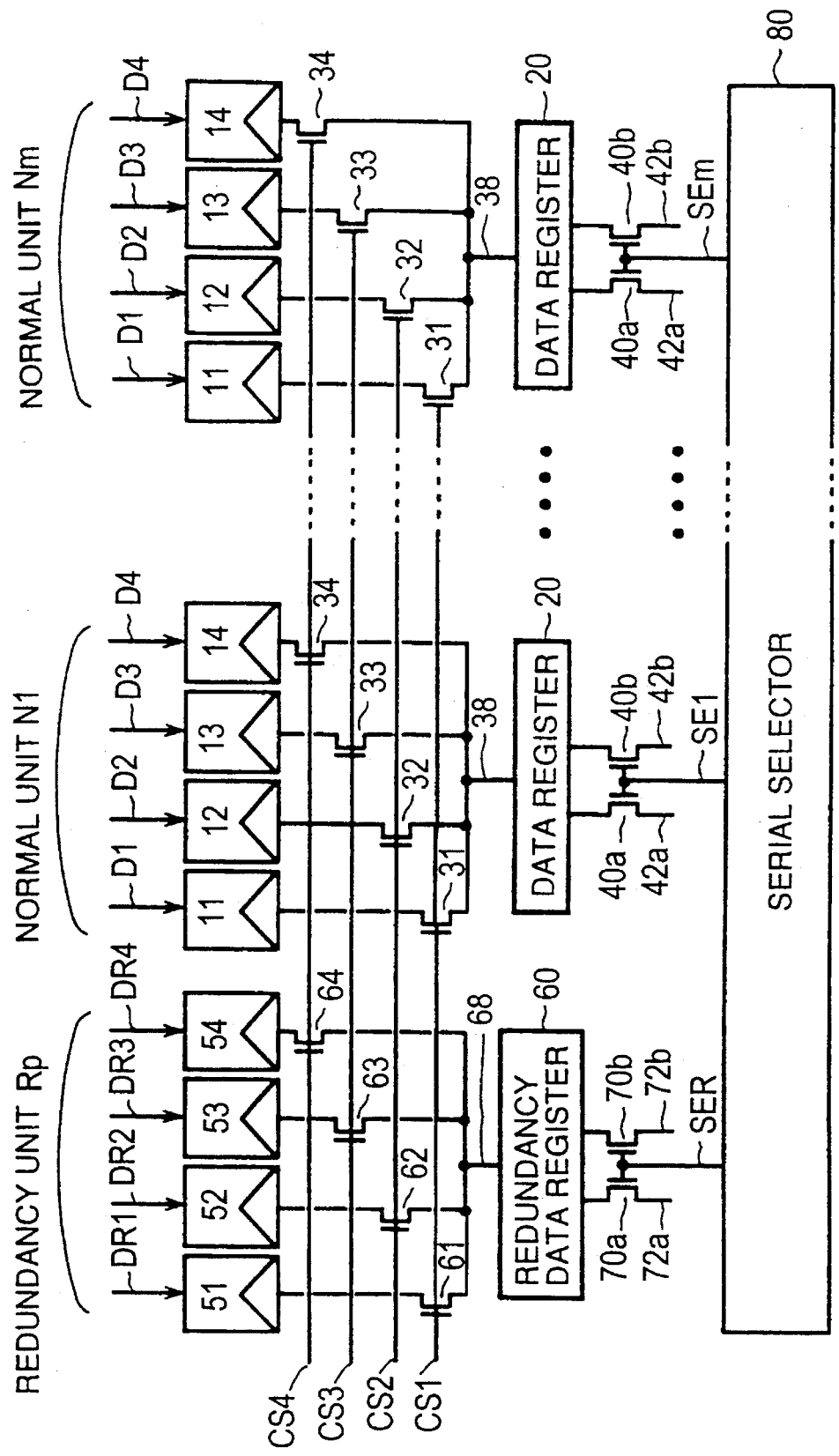
FIG. 2 is a block diagram showing a partial configuration of the conventional semiconductor memory device.

As described above, the serial access memory portion of the present invention is different from the conventional serial access portion shown in FIG. 2 in that data is transferred between each of redundancy sense amplifiers 51, 52 and redundancy data register 60 in response to two control signals. Unlike the redundancy unit Rp in the conventional serial access memory portion including four redundancy sense amplifiers 51–54, the redundancy unit R of the serial access memory portion of the present invention includes two redundancy sense amplifiers 51 and 52.

Redundancy data register 60 temporarily holds data transferred from redundancy sense amplifiers 51 and 52, and temporarily holds data to be transferred to redundancy sense amplifiers 51 and 52.

The pair of redundancy transfer gates 70a, 70b is formed of two N channel MOS transistors 70a and 70b. Redundancy select signal SER from serial selector 80 is applied to gate electrodes of these N channel MOS transistors 70a and 70b. These N channel MOS transistors 70a and 70b are connected between redundancy data register 60 and redundancy data buses 72a, 72b.

In normal operation, that is, when correct data is read out from all data registers 20, serial selector 80 sequentially selects m data registers 20, and transfers data between the selected data register 20 and data buses 42a, 42b. Therefore, m select signals SE1-SEm sequentially rises to the H level.

On the other hand, in abnormal operation, that is, when data read out from any one of data registers 20 is nor correct, serial selector 80 selects redundancy data register 60 instead of data register 20 from which the incorrect data is read out, and transfers data between redundancy data register 60 and redundancy data buses 72a, 72b. Therefore, redundancy select signal SER is pulled up to the H level instead of select signals SE1-SEm for selecting data register 20 from which incorrect data is read out.

Operation of the serial access memory portion will now be described.

In normal operation, the serial access memory portion of the present invention operates similar to the above conventional serial access memory portion. More specifically, data read out from the memory cell array is amplified and held by sense amplifiers 11–14 in normal units N1-Nm.

Then, when control signal CS1, for example, rises to the H level, all transfer gates 31 in normal units N1-Nm are rendered conductive, and data of sense amplifiers 11 is transferred to all data registers 20 at a time through data transfer lines 38.

When select signals SE1-SEm from serial selector 80 sequentially rise to the H level, the transfer gate pairs 40a, 40b are rendered conductive. As a result, data of data registers 20 is sequentially transferred to data buses 42a, 42b through transfer gate pairs 40a, 40b, and further provided externally.

When control signal CS2 rises to the H level, all transfer gates 32 in normal units N1-Nm are rendered conductive, and data of sense amplifiers 12 is transferred to data registers 20. Data transferred to data registers 20 is provided externally through transfer gate pairs 40a, 40b sequentially, similar to the case where control signal CS1 rises to the H level.

The above description holds true in the case where control signals CS3 and CS4 rise to the H level.

On the other hand, in abnormal operation, that is, when data read out from normal units N1-Nm is not correct, correct data is stored in advance in a memory cell corresponding to the redundancy unit R.

When data read out to data register 20 through sense amplifier 13 and transfer gate 33 in normal unit N1, for example, is "0" although it should be "1", the correct data "1" is stored in advance in a memory cell corresponding to redundancy sense amplifier 51 so that the correct data "1" is read out to redundancy data register 60 through redundancy sense amplifier 51 and redundancy transfer gate 63.

Data D1–D4, DR1 and DR2 read out from the memory cell array in this state is amplified and held by all sense amplifiers 11–14 in normal units N1-Nm. Simultaneously, the data is amplified and held by redundancy sense amplifiers 51 and 52 in the redundancy unit R.

When control signal CS3 rises to the H level, for example, all transfer gates 33 in normal units N1-Nm are rendered conductive, and redundancy transfer gate 63 in the redundancy unit R is also rendered conductive. When transfer gates 33 are rendered conductive, data of sense amplifiers 13 is transferred to data registers 20 at a time. When redundancy transfer gate 63 is rendered conductive, data of redundancy sense amplifier 51 is transferred to redundancy data register 60 through redundancy data transfer line 68. At this time, erroneous data "0" is held in data register 20 in normal unit N1. Correct data "1" is held in redundancy data register 60 instead of the erroneous data Then, select signals SE1-SEm from serial selector 80 sequentially rise to the H level. However, redundancy select signal SER rises to the H level instead of select signal SE1. Therefore, in response to the H level of redundancy select signal SER, the redundancy transfer gate pair 70a, 70b is rendered conductive. As a result, the correct data "1" of redundancy data register 60 is transferred to redundancy data buses 72a, 72b through the redundancy transfer gate pair 70a, 70b, and further provided externally.

When select signal SE2 (not shown) rises to the H level, data in data register 20 (not shown) in normal unit N2 (not shown) is provided externally. Similarly, data in data registers 20 in normal units N3 (not shown)—Nm is sequentially provided externally.

As described above, the correct data "1" in redundancy data register 60 in the redundancy unit R is provided instead of the erroneous data "0" in data register 20 in normal unit N1. Therefore, although the erroneous data "0" is transferred to data register 20 through sense amplifier 13 and transfer gate 33 in normal unit N1, data sequentially provided externally is all correct. Therefore, a frame buffer memory including the serial access memory portion can be used as a non-defective product.

Similarly, when data transferred to data register 20 through sense amplifier 14 and transfer gate 34 in normal unit N1, for example, is not correct, redundancy transfer gate 64 is rendered conductive in response to control signal CS4 attaining the H level, and correct data in redundancy sense amplifier 51 is transferred to redundancy data register 60. Therefore, although data transferred to data register 20 through sense amplifier 14 and transfer gate 34 in normal unit N1 is not correct, data sequentially provided from the serial access memory portion is all correct.

As described above, in the redundancy unit R, redundancy transfer gate 63 responding to control signal CS3 and redundancy transfer gate 64 responding to control signal CS4 are connected between redundancy sense amplifier 51 and redundancy data register 60. Therefore, even if one of data transferred through sense amplifiers 13 and transfer gates 33 in normal units N1-Nm, and data transferred through sense amplifiers 14 and transfer gates 34 in normal units N1-Nm is not correct, data in redundancy sense amplifier 51 is transferred to redundancy data register 60 through redundancy transfer gate 63 or 64.

Similarly, even if either data transferred through sense amplifiers 11 and transfer gates 31 in normal units N1-Nm, or data transferred through sense amplifiers 12 and transfer gates 32 in normal units N1-Nm is not correct, data in redundancy sense amplifier 52 is transferred to redundancy data register 60 through redundancy transfer gate 61 or 62.

As described above, in the serial access memory portion, the number of redundancy sense amplifiers 51 and 52 is one half of the number of redundancy sense amplifiers 51–54 in the conventional serial access memory portion. Therefore, the layout area occupied by the serial access memory portion becomes smaller than the conventional case.

In the serial access memory portion of the present invention, correct data is sequentially provided externally even if sense amplifiers 11 and 13, sense amplifiers 11 and 14, sense amplifiers 12 and 13, and sense amplifiers 12 and 14 become defective simultaneously, respectively.

Further, even when sense amplifier 11 in a normal unit and sense amplifier 13 in the other normal unit become defective simultaneously, correct data is sequentially provided externally.

Therefore, although the serial access memory portion of the present invention includes a smaller number of sense amplifiers, it can remedy effectively a frame buffer memory which should be otherwise a defective frame buffer memory as a non-defective frame buffer memory.

One embodiment of the present invention was described above in detail. However, the present invention is not limited to the above embodiment, but can be implemented in the other manners.

Although each of normal units N1-Nm includes four sense amplifiers 11–14, for example, the number of sense amplifiers is not limited to four. Similarly, although the redundancy unit R includes two redundancy sense amplifiers 51 and 52, the number of redundancy sense amplifiers is not limited to two.

Although two redundancy transfer gates 61 and 62 (63 and 64) are connected between one redundancy sense amplifier 52 (51) and redundancy data register 60, the number of transfer gates is not limited thereto. Three transfer gates respectively responding to three control signals, for example, may be connected between one redundancy sense amplifier 51 (52) and redundancy data register 60. In this case, the number of redundancy sense amplifiers is further reduced, although the frame buffer memory cannot be remedied, if two of corresponding three sense amplifiers are defective.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a redundancy circuit and capable of storing a plurality of data and reading out stored data serially, comprising:

a first plurality of normal sense amplifiers amplifying stored data as it is read;

a second plurality of normal registers each connectable to a plurality of normal sense amplifiers;

a plurality of sets of normal transferring means, each set connected to a respective one of said normal registers and each normal transferring means selectively transferring data between one of said normal sense amplifiers and its corresponding normal register;

one or more, but less than said first plurality, redundancy sense amplifiers amplifying stored data;

a redundancy register provided for said one or more redundancy sense amplifiers;

a set of redundancy transferring means for transferring data between said one or more redundancy sense amplifiers and said redundancy register when each of said sets of normal transferring means transfers data between one of said normal sense amplifiers and a corresponding normal register, and when each of said normal transferring means transfers data between at least another sense amplifier and said another sense amplifier's corresponding normal register; and selecting means for selecting said plurality of normal registers serially and transferring data between the selected normal register and an external portion when said redundancy circuit is inactivated, and for selecting said redundancy register instead of one of said normal registers and transferring data between the redundancy register and the external portion when said redundancy circuit is activated.

2. The semiconductor memory device as recited in claim 1, wherein each of said normal transferring means includes
a predetermined number of normal switching elements provided corresponding to said predetermined number of normal sense amplifiers and each connected between a corresponding normal sense amplifier and a corresponding normal register to be turned on in response to one of a predetermined number of control signals corresponding to said predetermined number of normal sense amplifiers, and said redundancy transferring means includes
a redundancy switching element connected between said redundancy sense amplifier and said redundancy register to be turned on in response to at least two of said control signals.

3. The semiconductor memory device as recited in claim 2, wherein said selecting means includes
a serial selector serially generating normal select signals for selecting said plurality of normal registers when said redundancy circuit is inactivated, and generating a redundancy select signal for selecting said redundancy register instead of one of said normal registers when said redundancy circuit is activated, a plurality of normal transfer gates provided corresponding to said plurality of normal registers, and each connected between a corresponding normal register and an external portion to be turned on in response to a corresponding one of said normal select signals, and a redundancy transfer gate connected between said redundancy register said an external portion to be turned on in response to said redundancy select signal.

4. A semiconductor memory device including a redundancy circuit and capable of storing a plurality of data and reading out the stored data serially, comprising:

(a) a plurality of normal units each including
an even number of normal sense amplifiers amplifying said data,
a normal register provided corresponding to said even number of normal sense amplifiers, and
an even number of normal switching elements provided corresponding to said even number of normal sense amplifiers and each connected between a corresponding normal sense amplifier and said normal register;

(b) a redundancy unit including
a plurality of redundancy sense amplifiers amplifying said data, and each provided corresponding to two of said normal sense amplifiers,
a redundancy register provided corresponding to said plurality of redundancy sense amplifiers, and
a plurality of redundancy switching elements provided corresponding to said plurality of redundancy sense amplifiers, and each connected between a corresponding redundancy sense amplifier and said redundancy register;

(c) an even number of signal lines provided corresponding to said plurality of normal sense amplifiers and in common to said normal and redundancy units,
each of said normal switching elements being turned on in response to a corresponding one of said signal lines, and each of said redundancy switching elements being turned on in response to corresponding two of said signal lines;

said semiconductor memory device further comprising (d) selecting means for selecting the normal registers in said plurality of normal units serially and transferring data between the selected normal register and an external portion when said redundancy circuit is inactivated, and for selecting said redundancy register instead of one of said normal registers said transferring data between the redundancy register and an external portion when said redundancy circuit is activated.

5. The semiconductor memory device as recited in claim 4, wherein each of said normal switching elements includes
a normal transistor having a gate electrode connected to said corresponding one signal line, and each of said redundancy switching elements includes
a first redundancy transistor having a gate electrode connected to one of said corresponding two signal lines, and
a second redundancy transistor having a gate electrode connected to the other of said corresponding two signal lines.

6. The semiconductor memory device as recited in claim 5, wherein said selecting means includes
a serial selector serially generating normal select signals for selecting the normal registers in said plurality of normal units when said redundancy circuit is inactivated, and generating a redundancy select signal for selecting said redundancy register instead of one of said normal registers when said redundancy circuit is activated, a plurality of normal transfer gates provided corresponding to the normal registers in said plurality of normal units, and each connected between a corresponding normal register and an external portion to be turned on in response to a corresponding one of said normal select signals, and a redundancy transfer gate connected between said redundancy register and the external portion to be turned on in response to said redundancy select signal.

* * * * *